(12) United States Patent
Escamilla et al.

(10) Patent No.: US 10,863,647 B1
(45) Date of Patent: Dec. 8, 2020

(54) ASSIST MECHANISM FOR INFORMATION HANDLING SYSTEM

(71) Applicant: DELL PRODUCTS, LP, Round Rock, TX (US)

(72) Inventors: Eduardo Escamilla, Round Rock, TX (US); Matthew Bryan Gilbert, Austin, TX (US); Richard Andrew Crisp, Austin, TX (US); Juan Manuel Gonzalez, Round Rock, TX (US); Noman Mithani, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/570,109

(22) Filed: Sep. 13, 2019

(51) Int. Cl.
  *H05K 7/16* (2006.01)
  *H05K 5/02* (2006.01)
(52) U.S. Cl.
  CPC ............... *H05K 7/16* (2013.01); *H05K 5/023* (2013.01); *H05K 5/0221* (2013.01)

(58) Field of Classification Search
  CPC ........................................................ H05K 5/00
  See application file for complete search history.

(56) References Cited

U.S. PATENT DOCUMENTS

| | | | |
|---|---|---|---|
| 7,086,721 B2 | 8/2006 | Silverbrook et al. | |
| 7,400,499 B2 | 7/2008 | Mundt et al. | |
| 8,634,189 B2 | 1/2014 | Escamilla et al. | |
| 2003/0223201 A1* | 12/2003 | Son | G06F 1/185 |
| | | | 361/752 |
| 2005/0135910 A1 | 6/2005 | Pruteanu et al. | |

\* cited by examiner

*Primary Examiner* — Jerry Wu
(74) *Attorney, Agent, or Firm* — Larson Newman, LLP

(57) ABSTRACT

A mechanism for servicing a sled installed in a server includes a grip bar, and a four-bar linkage connected to the grip bar. The four-bar linkage has a first position that engages the sled to a chassis of the server, and a second position that disengages the sled from the chassis of the server. Movement of the grip bar moves the four-bar linkage from the first position to the second position, thus disengaging the sled from the chassis and allowing the sled to be removed from the chassis for service.

20 Claims, 8 Drawing Sheets

ASSIST MECHANISM FOR INFORMATION HANDLING SYSTEM

FIELD OF THE DISCLOSURE

This disclosure generally relates to information handling systems, and more particularly relates to the mechanical release of a computing sled from a server rack.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A sled for installation in a server has an assist mechanism that is connected to the sled and is manually operated by a grip bar. Movement of the grip bar pivots and/or slides bar members of a four-bar linkage. The grip bar, for example, has a stowed position in which a bar member of the four-bar linkage mechanically engages the sled to a chassis of the server. When the grip bar is stowed, the sled is secured within the chassis. The grip bar also has a deployed position in which the bar member of the four-bar linkage mechanically disengages the sled from the chassis of the server. When the grip bar is fully deployed, the sled is released from the chassis. As the grip bar is moved, the bar member of the four-bar linkage progressively engages, or disengages, the sled from the chassis depending on a direction of the movement of the grip bar. The assist mechanism has generous travel with mechanical advantage, but the assist mechanism requires little space for actuation. The assist mechanism may also be tuned or configured to adjust the travel and the mechanical advantage.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings.

Figure 1:
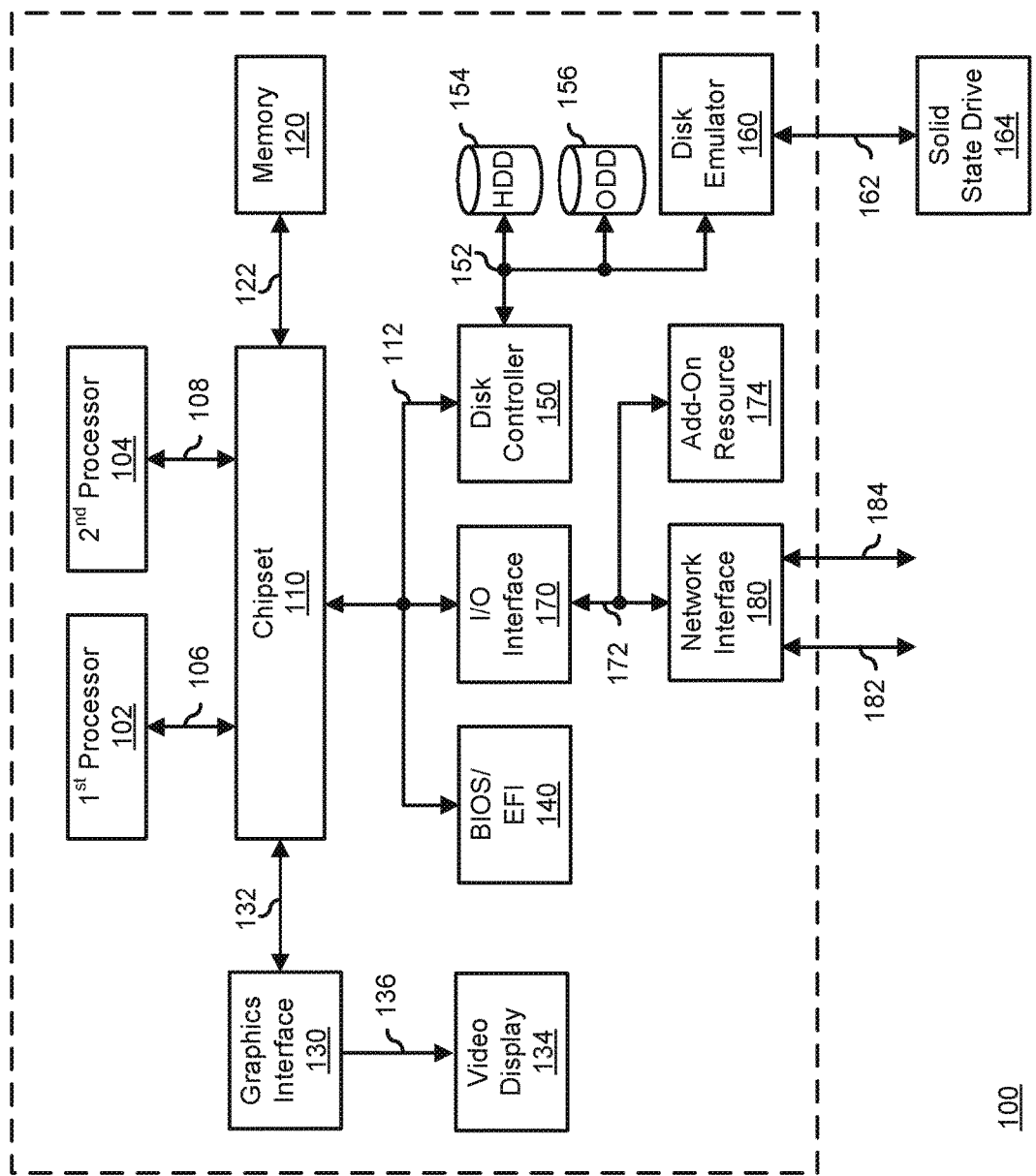
FIG. 1 is a block diagram of a generalized information handling system.

FIG. 1 illustrates an embodiment of an information handling system 100 including processors 102 and 104, chipset 110, memory 120, graphics adapter 130 connected to video display 134, non-volatile RAM (NV-RAM) 140 that includes a basic input and output system/extensible firmware interface (BIOS/EFI) module 142, disk controller 150, hard disk drive (HDD) 154, optical disk drive (ODD) 156, disk emulator 160 connected to solid state drive (SSD) 164, an input/output (I/O) interface 170 connected to an add-on resource 174, a trusted platform module (TPM) 176, a network interface device 180, and a baseboard management controller (BMC) 190. Processor 102 is connected to chipset 110 via processor interface 106, and processor 104 is connected to chipset 110 via processor interface 108.

Chipset 110 represents an integrated circuit or group of integrated circuits that manages data flow between processors 102 and 104 and the other elements of information handling system 100. In a particular embodiment, chipset 110 represents a pair of integrated circuits, such as a north bridge component and a south bridge component. In another embodiment, some or all of the functions and features of chipset 110 are integrated with one or more of processors 102 and 104. Memory 120 is connected to chipset 110 via a memory interface 122. An example of memory interface 122 includes a Double Data Rate (DDR) memory channel, and memory 120 represents one or more DDR Dual In-Line Memory Modules (DIMMs). In a particular embodiment, memory interface 122 represents two or more DDR channels. In another embodiment, one or more of processors 102 and 104 include memory interface 122 that provides a dedicated memory for the processors. A DDR channel and the connected DDR DIMMs can be in accordance with a particular DDR standard, such as a DDR3 standard, a DDR4 standard, a DDR5 standard, or the like. Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like.

Graphics adapter 130 is connected to chipset 110 via a graphics interface 132, and provides a video display output 136 to a video display 134. An example of a graphics interface 132 includes a peripheral component interconnect-express interface (PCIe) and graphics adapter 130 can include a four lane (×4) PCIe adapter, an eight lane (×8) PCIe adapter, a 16-lane (×16) PCIe adapter, or another configuration, as needed or desired. In a particular embodiment, graphics adapter 130 is provided on a system printed circuit board (PCB). Video display output 136 can include a digital video interface (DVI), a high definition multimedia interface (HDMI), DisplayPort interface, or the like. Video display 134 can include a monitor, a smart television, an embedded display such as a laptop computer display, or the like.

NV-RAM 140, disk controller 150, and I/O interface 170 are connected to chipset 110 via I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including an Industry Standard Architecture (ISA) interface, a Small Computer Serial Interface (SCSI) interface, an Inter-Integrated Circuit (I$^2$C) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller 150 to HDD 154, to ODD 156, and to disk emulator 160. Disk interface 152 may include an integrated drive electronics (IDE) interface, an advanced technology attachment (ATA) such as a parallel ATA (PATA) interface or a serial ATA (SATA) interface, a SCSI interface, a USB interface, a proprietary interface, or a combination thereof. Disk emulator 160 permits a solid-state drive (SSD) 164 to be connected to information handling system 100 via an external interface 162. An example of external interface 162 includes a USB interface, an IEEE 1394 (Firewire) interface, a proprietary interface, or a combination thereof. Alternatively, SSD 164 can be disposed within information handling system 100.

I/O interface 170 includes a peripheral interface 172 that connects I/O interface 170 to add-on resource 174, to TPM 176, and to network interface device 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a sound card, data storage system, an additional graphics interface, another add-on resource, or a combination thereof. Add-on resource 174 can be on a main circuit board, a separate circuit board or an add-in card disposed within information handling system 100, a device that is external to the information handling system, or a combination thereof.

Network interface device 180 represents a network communication device disposed within information handling system 100, on a main circuit board of the information handling system, integrated onto another element such as chipset 110, in another suitable location, or a combination thereof. Network interface device 180 includes a network channel 182 that provides an interface to devices that are external to information handling system 100. In a particular embodiment, network channel 182 is of a different type than peripheral channel 172 and network interface device 180 translates information from a format suitable to the peripheral channel to a format suitable to external devices. In a particular embodiment, network interface device 180 includes a host bus adapter (HBA), a host channel adapter, a network interface card (NIC), or other hardware circuit that can connect the information handling system to a network. An example of network channel 182 includes an InfiniBand channel, a fiber channel, a gigabit Ethernet channel, a proprietary channel architecture, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out of band monitoring, maintenance, and control of the elements of the information handling system. As such, BMC 190 represents a processing device different from processors 102 and 104, which provides various management functions for information handling system 100. In an embodiment, BMC 190 may be responsible for granting access to a remote management system that may establish control of the elements to implement power management, cooling management, storage management, and the like. The BMC 190 may also grant access to an external device. In this case, the BMC may include transceiver circuitry to establish wireless communications with the external device such as a mobile device. The transceiver circuitry may operate on a Wi-Fi channel, a near-field communication (NFC) channel, a Bluetooth or Bluetooth-Low-Energy (BLE) channel, a cellular based interface such as a global system for mobile (GSM) interface, a code-division multiple access (CDMA) interface, a universal mobile telecommunications system (UMTS) interface, a long-term evolution (LTE) interface, another cellular based interface, or a combination thereof. A mobile device may include Ultrabook, a tablet computer, a netbook, a notebook computer, a laptop computer, mobile telephone, a cellular telephone, a smartphone, a personal digital assistant, a multimedia playback device, a digital music player, a digital video player, a navigational device, a digital camera, and the like.

The term BMC may be used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller, and embedded controllers included at the blades of the blade server can be referred to as blade management controllers. Out-of-band communication interfaces between BMC and elements of the information handling system may be provided by management interface 192 that may include an inter-integrated circuit (I2C) bus, a system management bus (SMBUS), a power management bus (PMBUS), a low pin count (LPC) interface, a serial bus such as a universal serial bus (USB) or a serial peripheral interface (SPI), a network interface such as an Ethernet interface, a high-speed serial data link such as PCIe interface, a network controller-sideband interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

In an embodiment, the BMC 190 implements an integrated remote access controller (iDRAC) that operates to monitor and maintain system firmware, such as code stored in BIOS/EFI module 142, option ROMs for graphics interface 130, disk controller 150, add-on resource 174, network interface 180, or other elements of information handling system 100, as needed or desired. In particular, BMC 190 includes a network interface 194 that can be connected to a remote management system to receive firmware updates, as needed or desired. Here BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 190, an interface defined by the Distributed Management Taskforce (DMTF) (such as Web Services Management (WS-MAN) interface, a Management Component Transport Protocol (MCTP) or, Redfish interface), various vendor defined interfaces (such as Dell EMC Remote Access Controller Administrator (RACADM) utility, Dell EMC Open Manage Server Administrator (OMSS) utility, Dell EMC Open Manage Storage Services (OMSS) utility, Dell EMC Open Manage Deployment Toolkit (DTK) suite), representational state transfer (REST) web API, a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100, or is integrated into another element of the information handling system such as chipset 110, or another suitable element, as needed or desired. As such, BMC 190 can be part of an integrated circuit or a chip set within information handling system 100. BMC 190 may operate on a separate power plane from other resources in information handling system 100. Thus BMC 190 can communicate with the remote management system via network interface 194 or the BMC can communicate with the external mobile device using its own transceiver circuitry while the resources or elements of information handling system 100 are powered off or at least in low power mode. Here, information can be sent from the remote management system or external mobile device to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

In a typical usage case, information handling system 100 represents an enterprise class processing system, such as may be found in a datacenter or other compute-intense processing environment. Here, there may be hundreds or thousands of other enterprise class processing systems in the datacenter. In such an environment, the information handling system may represent one of a wide variety of different types of equipment that perform the main processing tasks of the datacenter, such as modular blade servers, switching and routing equipment (network routers, top-of-rack switches, and the like), data storage equipment (storage servers, network attached storage, storage area networks, and the like), or other computing equipment that the datacenter uses to perform the processing tasks.

Open Compute Project (OCP) is an organization that promotes efficient hardware designs for scalable computing. The OCP has proposed a server project that provides standardized system specifications. One of these specifications includes an OCP module having defined locations of notches along its outer perimeter. The OCP module may include a peripheral card such as the NIC that can be installed or removed from the information handling system. Further information may be found in OCP NIC 3.0 specification at www.opencompute.org/documents, which is incorporated herein by reference in its entirety.

Figure 2:
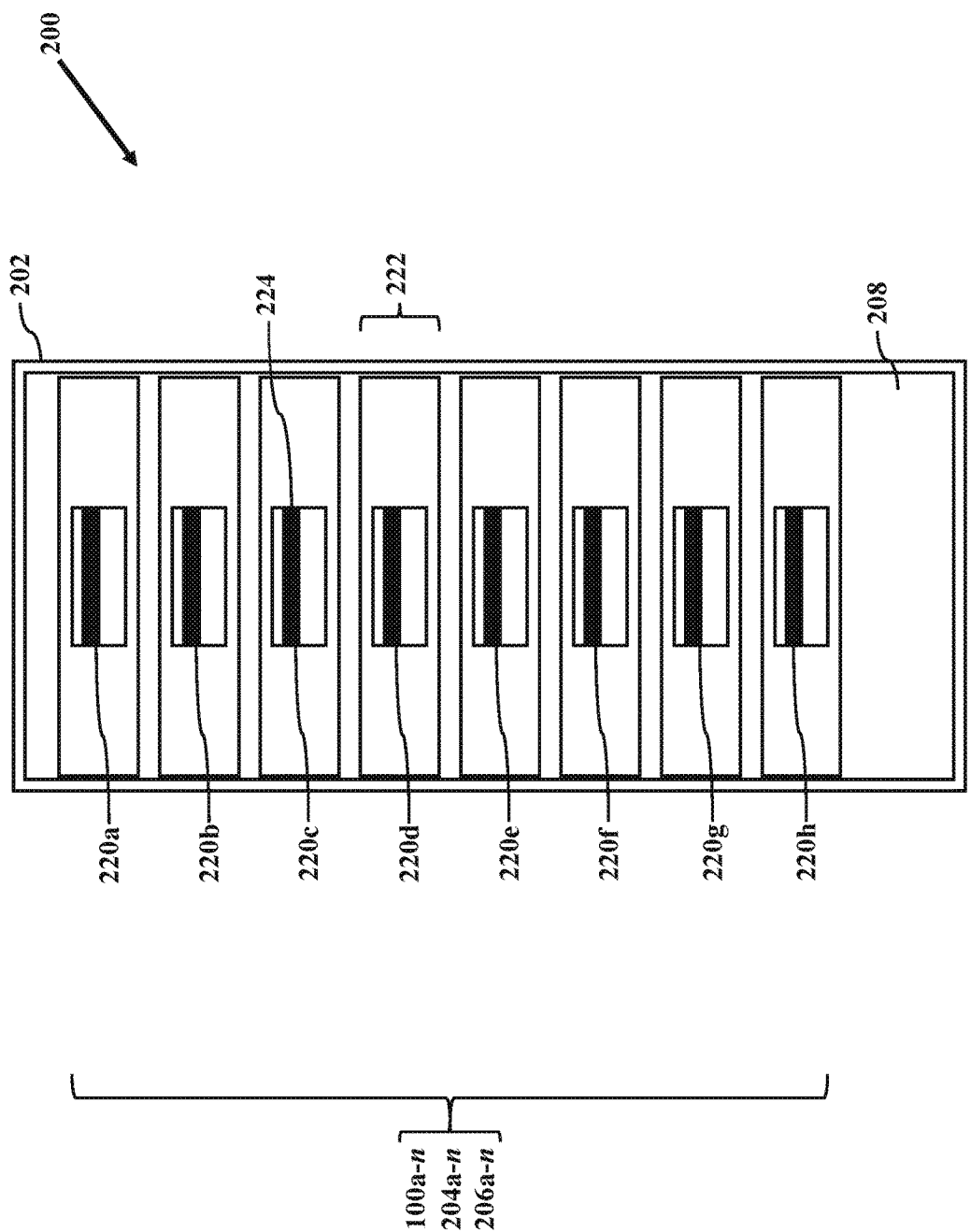
FIGS. 2 and 3 illustrate a blade server ecosystem, according to exemplary embodiments.
Figure 3:
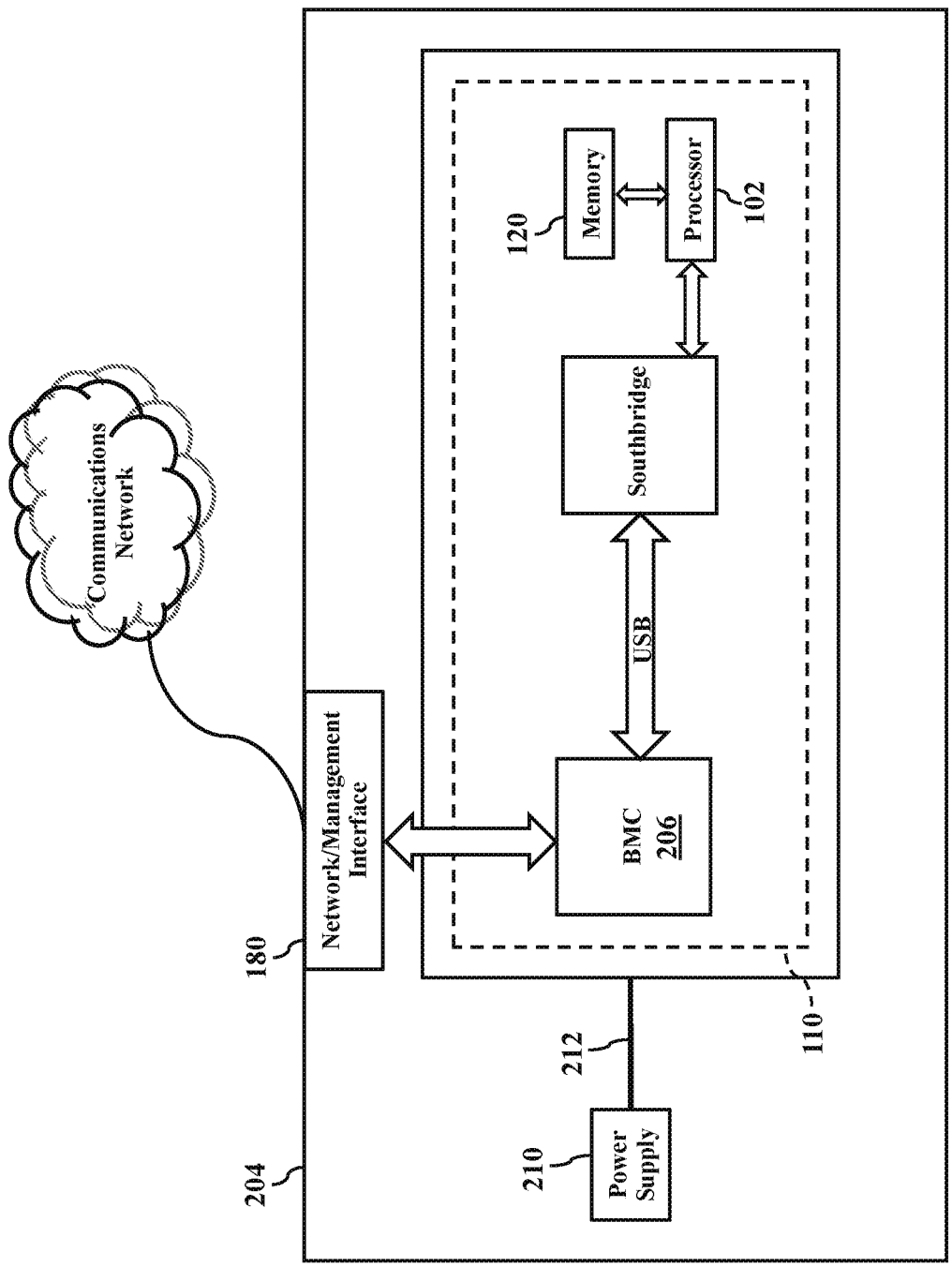

FIGS. 2 and 3 show a blade server ecosystem 200 that is another example of an information handling system 100. The blade server ecosystem 200 has a common chassis 202 that houses or contains multiple computing or storage blades or sleds 204. Each individual blade or sled 204 may have its own corresponding baseboard management controller 206 and the network interface 180 to a communications network. The blade or sled 204 has a physical/electrical connection to a power supply 210, so the blade or sled 204 receives an electrical power 212 for the baseboard management controller 206 and the network interface 180. The blade or sled 204 has other componentry, but explanations of most of those components are not necessary for this disclosure. Because the blade server ecosystem may have many individual or separate blades or sleds 204*a-n*, the blade server ecosystem may have one or more chassis management controllers 208 accessible via the chassis 202. The individual blades or sleds 204 communicate with the chassis management controller 208 I/O interfaces, such as ISA, SCSI, I²C, SPI, and/or USB.

Each computing sled 204*a-n* may also have a corresponding assist mechanism 220*a-n*. The assist mechanism 220 is connected to the corresponding sled 204 and allows a human user, such as a technician or engineer, to release and to remove the sled 204 from within the corresponding bay or slot 222 in the module chassis 202. For example, the assist mechanism 220 has a corresponding grab bar 224. When the human user wishes to remove the sled 204, the human user grasps and pulls the corresponding grab bar 224. As the grab bar 224 is pulled, the grab bar 224 pivots and/or slides one of more bar members of the assist mechanism 220 in a first direction to mechanically and/or electrically disengage the sled 204 from the corresponding bay or slot 222 in the modular chassis 202. Although not shown, the blade or sled 204 may be mounted or attached to a slider mechanism. The slider mechanism has a drive drawer mounted or affixed to extendable sliders. When the user successfully operates the assist mechanism 220, the assist mechanism 220 disengages from the chassis 202 and allows the drive drawer to be slid along the slider mechanism from within the chassis 202. The sled 204 may at last partially eject, thus allowing the human user to slide the sled 204 out of the bay or slot 222. Conversely, when the sled 204 is installed, the human user aligns the sled 204 to the bay or slot 222 and slides the sled 204 along the sliders. Once the sled 204 is sufficiently slid or inserted into the bay or slot 222, one or more of the bar members of the assist mechanism 220 align with engagement features, thus allowing the human user to pivot the grab bar 224 in an opposite, second direction to mechanically and/or electrically engage the sled 204 to the corresponding bay or slot 222 in the modular chassis 202.

Figure 4:
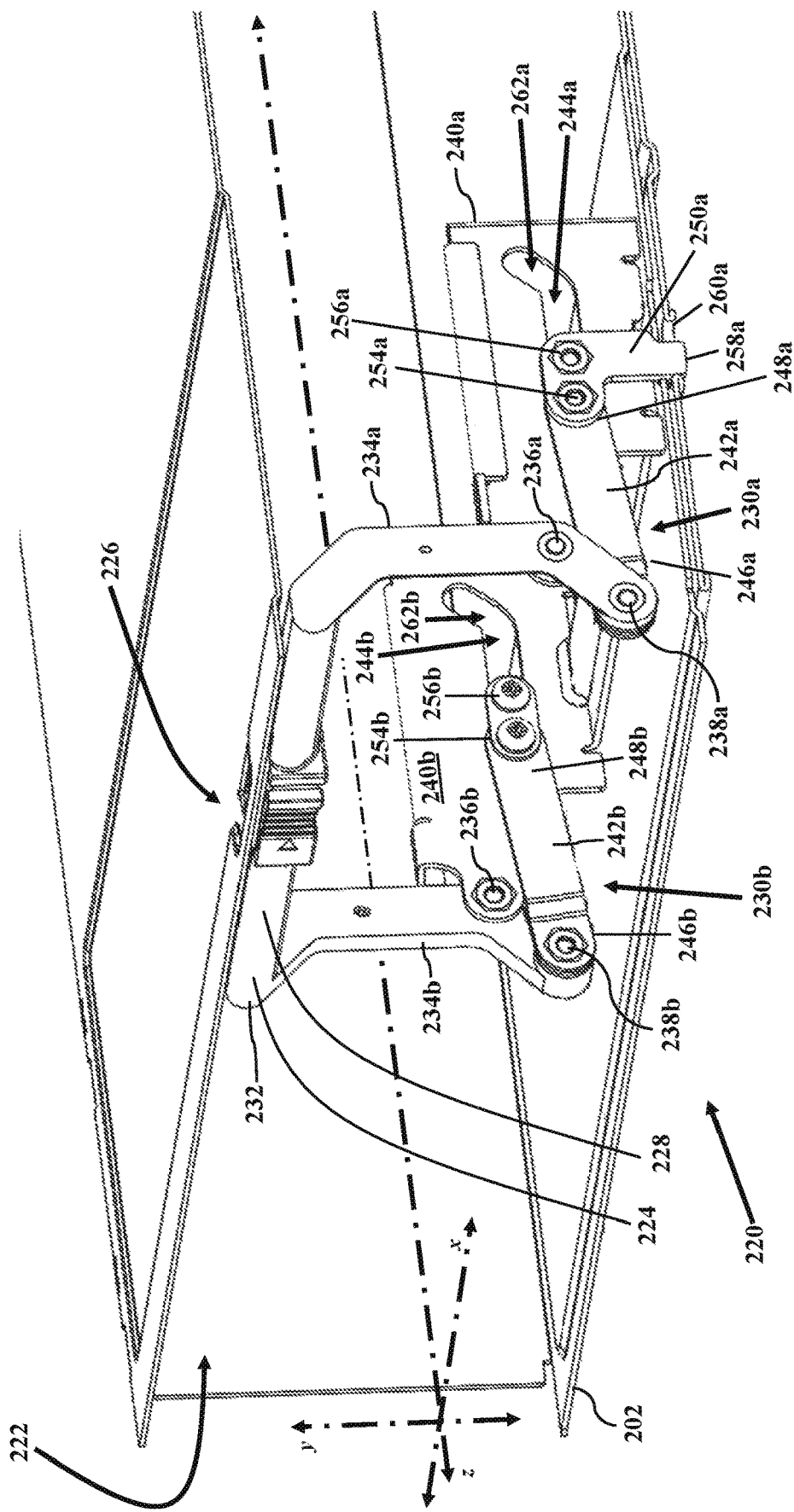
FIG. 4 is a perspective view of an assist mechanism, according to exemplary embodiments.

FIG. 4 shows the assist mechanism 220 without the installed sled 204. When the human user wishes to access, remove, replace, or otherwise service the sled 204, the user grasps the grab bar 224 to actuate or deploy the assist mechanism 220. First, however, the user may be required to disengage an optional thumb latch 226. That is, the thumb latch 226 may have features that engage a sheet metal wall of the modular chassis 202, and/or of the corresponding drive drawer. The thumb latch 226 is engaged to retain the grab bar 224 in a stowed position 228 to prevent accidental or inadvertent release. However, once the thumb latch 226 is manually disengaged, the grab bar 224 may release and/or move from the stowed position 228. The user may then pull the grab bar 224, such as in a downward motion to release the assist mechanism 220. As the user pulls the grab bar 224, the grab bar 224 sweeps inward to mechanically release the sled 204 from the chassis 202. The user may then outwardly pull the grab bar 224 to remove the sled 204.

The assist mechanism 220 has two opposed four-bar linkages 230a-b. While the grab bar 224 may have any shape, FIG. 4 illustrates a generally horseshoe or U-shaped main body 232 that defines or integrates the grab bar 224 with outwardly or downwardly extending left and right arms 234a-b. The left and right arms 234a-b each have two pivot points, illustrated as upper pivots 236a-b and lower pivots 238a-b. The upper pivots 236a-b are static with respect to a longitudinal z-axis, and are constrained to only rotationally pivot about side walls 240a-b of the assist mechanism 220. The lower pivots 238a-b, however, are rotationally/pivotally connected to slider bars 242a-b. Each slider bar 242a-b is configured to translate along the side walls 240a-b with respect to the longitudinal z-axis. The side walls 240a-b each have respective slots 244a-b that longitudinally extend into at least a portion of the bay or slot 222, such as along or parallel to the longitudinal z-axis. The front ends 246a-b of each slider bar 242a-b pivotally connect to the lower pivots 238a-b of each arm 234a-b. The opposite, rear ends 248a-b of each slider bar 242a-b slide within and along the slots 244a-b. Because each arm 234a-b has the two pivot points, such as the upper pivots 236a-b and the lower pivots 238a-b, each arm 234a-b may be considered a two-bar linkage.

The assist mechanism 220 also has two opposed latch bars. The right latch bar 250a is illustrated, but the left latch bar 250b is hidden from view by the left side wall 240b. Each latch bar 250a-b has a corresponding backing bar 252a-b. Only the left backing bar 252b is visible, as the right backing bar 252a is hidden from view by the right side wall 240a. Each latch bar 250a-b has a generally dog leg shape with two pivot points such as front pivot 254a-b and rear pivot 256a-b. The front pivots 254a-b are mechanically connected to the rear ends 248a-b of each slider bar 242a-b and to front ends of each backing bar 252a-b. The rear pivots 256a-b are mechanically connected to rear ends of each backing bar 252a-b. Each latch bar 250a-b has a corresponding hook or tang 258, although only 258a is visible that mechanically engages a feature such as a detent or even slot 260a in a bottom wall of the assist mechanism 220, perhaps a sheet metal bottom wall of the modular chassis 202 and/or the corresponding drive drawer.

The slots 244a-b may include corresponding lift regions 262a-b. As the slider bars 242a-b translate along the slots 244a-b, the rear ends 248a-b of the slider bars 242a-b will eventually push the latch bars 250a-b up and into the lift regions 262a-b. Further longitudinal translation along the slots 244a-b adds an upward, lifting motion in the x-axis direction to the hooks or tangs 258a-b.

Figure 5:
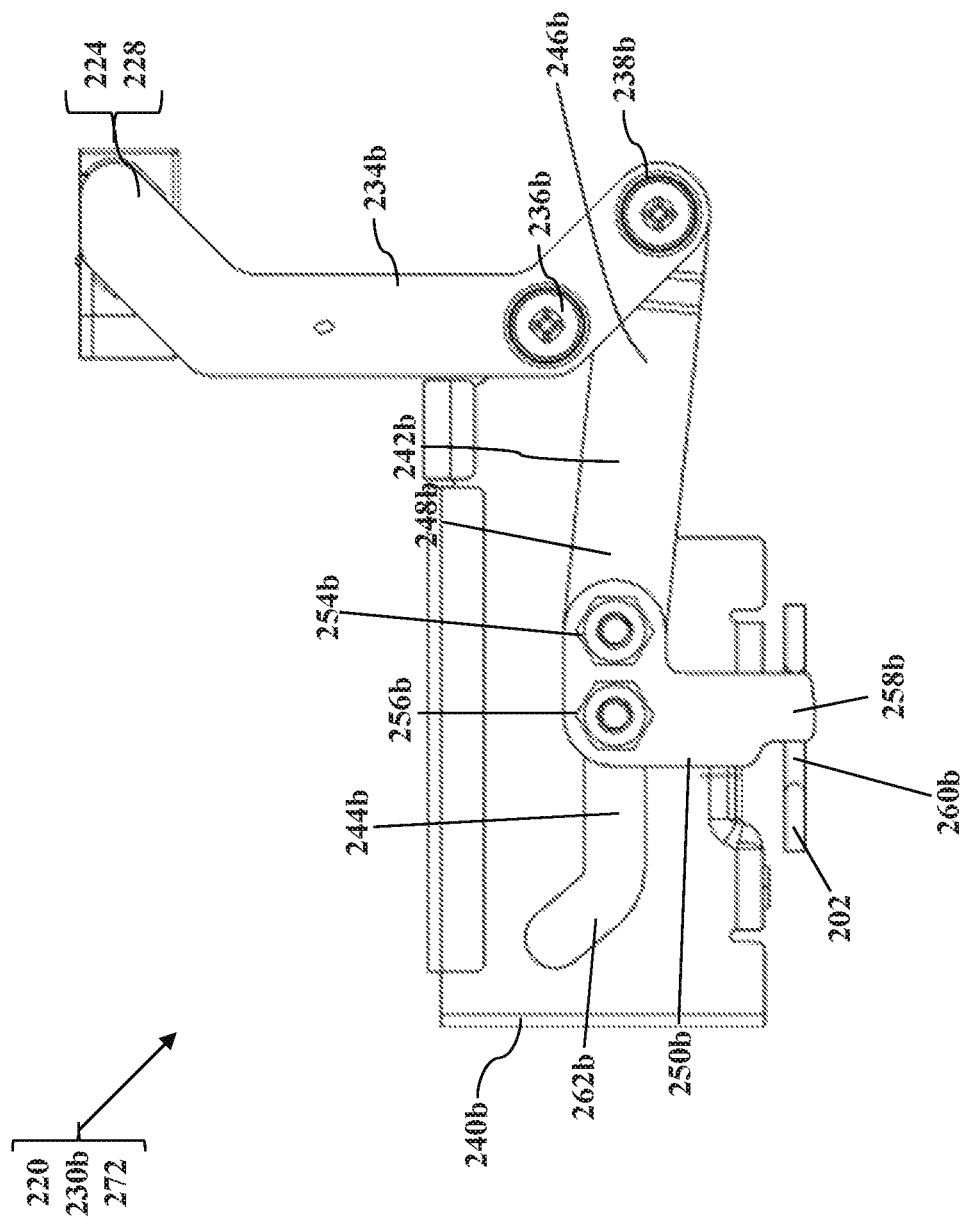
FIGS. 5 through 8 are side views of components and motions of the assist mechanism, according to exemplary embodiments.

FIGS. 5 through 8 show that as the grab bar 224 is moved from its upper or stowed position 228 to its lower or fully deployed position 270, the assist mechanism 220 progressively sweeps from a first position 272 of full engagement to a second position 274 of full disengagement. FIG. 5, for example, illustrates the left four-bar linkage 230b with the grab bar 224 in its upper or stowed position 228. The first position 272 of full engagement has the grab bar 224 at or near its stowed position 228. The arm 234b pulls the slider bar 242b to its nearly full forward translational position along the slot 244b, which mechanically slides and rotates the latch bar 250b and its hook or tang 258b into mechanical, interference position of full engagement with the detent/slot 260b in the wall or other structure of the chassis 202. The fit or tolerance of the engagement may have any width, length, and/or depth to suit a design or requirement for physical restraint or constraint. Because the assist mechanism 220 may be connected to the chassis 202 or drive drawer, the corresponding sled 204 is locked and secured within the bay 222.

Figure 6:
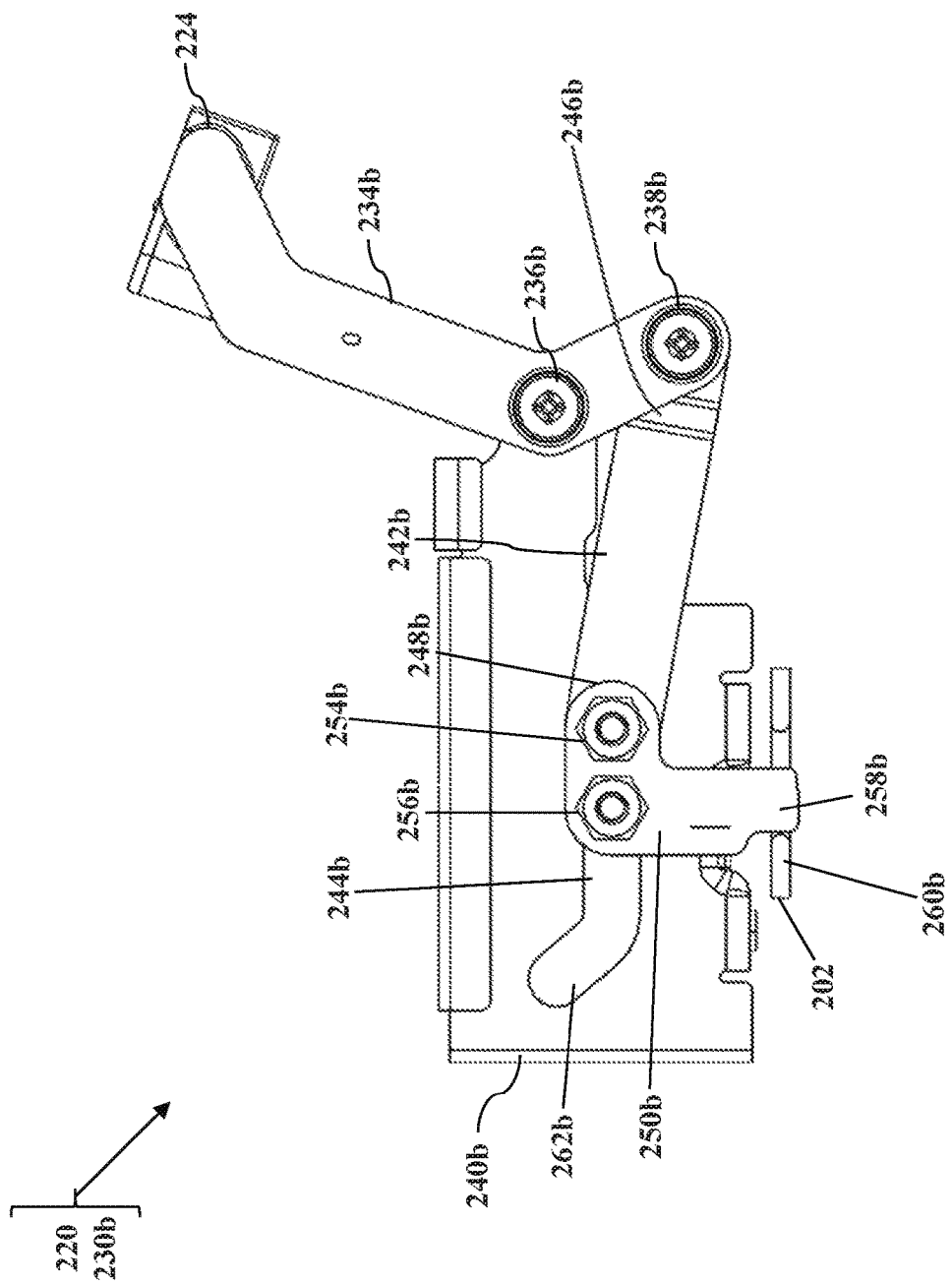

FIG. 6 shows a slightly downward transition of the grab bar 224 from the stowed position 228 in FIG. 5 to approximately fifteen degrees of rotation. Because the arm 234b may have a dog leg transition from the upper pivot 236b to the lower pivot 238b, the geometry of the arm 234b provides a mechanical leverage advantage to pivot the front end 246b of the slider bar 242b. However, this small downward rotational transition of the grab bar 224 may be insufficient to substantially push or slide the slider bar 242b along the slot 244b. The hook or tang 258b in the latch bar 250b may thus substantially or sufficiently remain in mechanical engagement with the detent/slot 260b in the wall of the chassis 202, bay 222, or other component.

Figure 7:
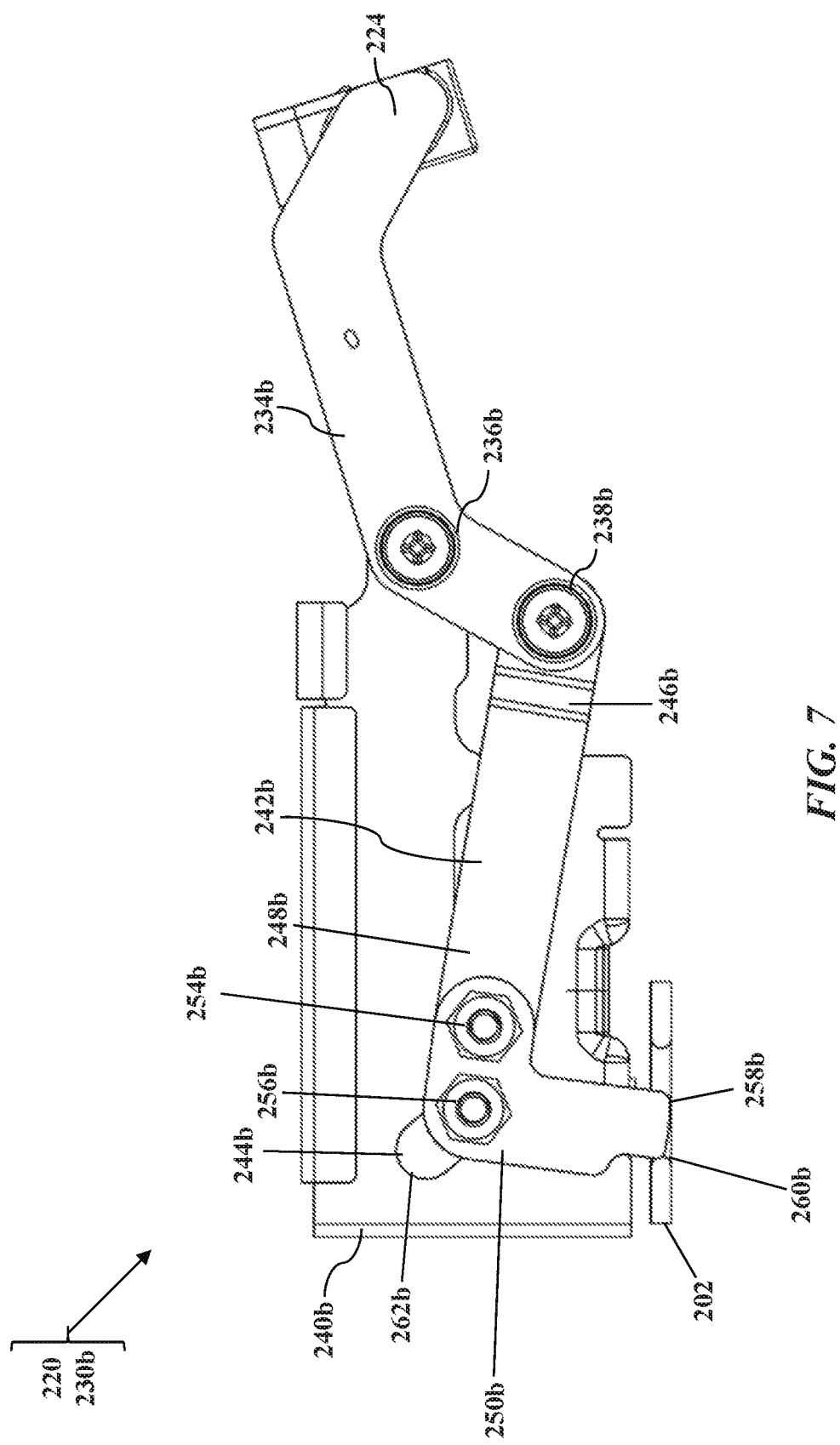

FIG. 7 shows the continued movement of the grab bar 224, applying a downward motion to the grab bar 224, the arm 234b rotates about the upper pivot 236b and the lower pivot 238b to push the slider bar 242b along the slot 244b with mechanical leverage. Here, though, sufficient movement of the slider bar 242b begins to pivot and/or to slide the latch bar 250b along the slot 244b to an initial portion of the lifting region 262b, thus adding a rotational pivot to the latch bar 250b. The rotation of the latch bar 250b at least begins to partially disengage the hook or tang 258b from the detent/slot 260b in the wall of the chassis 202, bay 222, or other component.

Figure 8:
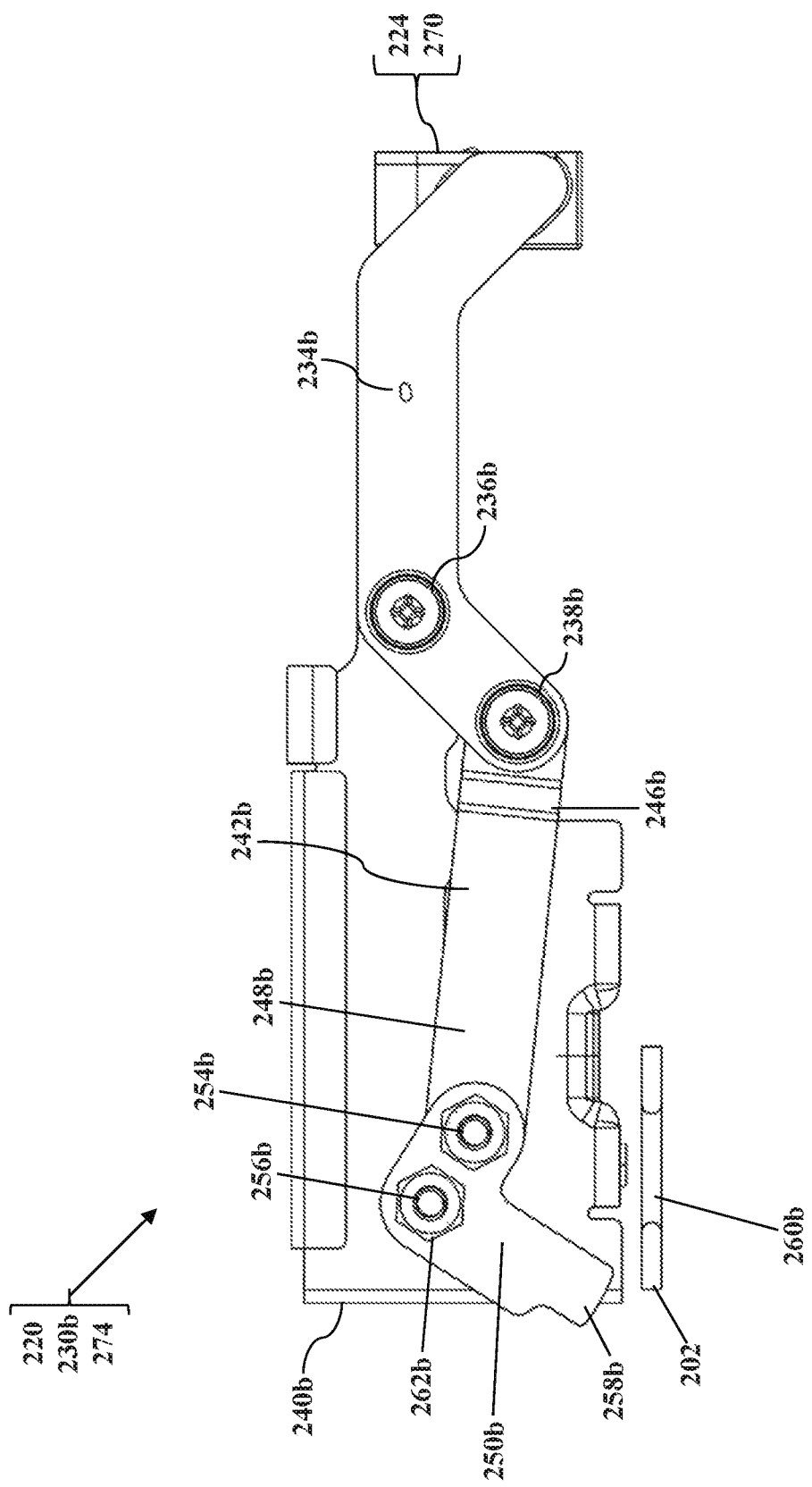

FIG. 8 shows the second position 274 of full disengagement. The grab bar 224 is pulled/swept to its fully deployed position 270. The arm 234b fully rotates about the upper pivot 236b and the lower pivot 238b pushes the slider bar 242b to a maximum, final position or travel along the slot 244b. The slider bar 242b concomitantly translates or slides the latch bar 250b into, up, and along the lift region 262b. The lift region 262b adds an upward, lifting motion in the x-axis direction to the rotating/pivoting latch bar 250b, which also lifts or raises the rotating/pivoting hook or tang 258b. In simple words, the hook or tang 258b is simultaneously lifted and pivoted to push off from the chassis 202 and thus fully disengage from the detent/slot 260b in the wall of the chassis 202, bay 222, or other comp.

The assist mechanism 220 has the left and right four-bar linkages 230a-b. As the user moves the grab bar 224, the assist mechanism 220 provides mechanical advantage or leverage to the user to push or translate the slider bars 242a-b along the slots 244a-b. This mechanical advantage or leverage helps overcome any friction and reduces manual effort. The assist mechanism 220 thus promotes an easy sweeping motion from the first position 272 of full engagement to the second position 274 of full disengagement. Indeed, the sizes and shapes of the grab bar 224, the arms 234a-b, the slider bars 242a-b, and the latch bars 250a-b may be adjusted or tuned to vary the effort, feel, and mechanical advantage. The locations of the pivots may likewise be adjusted or tuned to vary the effort, feel, and mechanical advantage.

The assist mechanism 220 is thus an elegant solution. Conventional cam levers have a long travel but little mechanical advantage. Moreover, conventional cam levers may fully disengage after only a minimal amount of travel. The assist mechanism 220, in contradistinction, utilizes the four-bar linkages 230a-b to translate along their respective slots 244a-b. The lift regions 262a-b add upward, lifting motion to lift the hook or tang 258a-b from the detent/slot 260a-b in the bottom wall. The assist mechanism 220 generates generous travel along both they-axis and the z-axis with mechanical advantage throughout most of the sweep. Moreover, the assist mechanism 220 only requires a small or tight amount of space in the z-axis to sweep from the first position 272 of full engagement to the second position 274 of full disengagement. The four-bar linkages 230a-b apply equal forces to the sides of the sled 204, thus helping to prevent mating misalignment.

Exemplary embodiments may be applied to any peripheral device. While this disclosure mostly explains the computing or storage sled 204, the assist mechanism 220 may be adapted to any modular component that is installed/removed from the sides/front/rear of the information handling system 100.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A mechanism for servicing a sled installed in a server, the mechanism comprising:
    a grab bar; and
    a four-bar linkage connected to the grab bar, the four-bar linkage having a slider bar pivotally connected to an arm connected to the grab bar, the four-bar linkage having a first position that engages a latch bar to a chassis of the server, and the four-bar linkage having a second position that disengages the sled from the chassis of the server, and a slot having a curved lifting region along which the slider bar slides;
    wherein a movement of the grab bar moves the slider bar and pushes the latch bar into the lifting region and moves the four-bar linkage from the first position to the second position, thus disengaging the latch bar and the sled from the chassis and allowing the sled to be removed from the chassis for service.

2. The mechanism of claim 1, wherein the four-bar linkage comprises a thumb latch.

3. The mechanism of claim 1, further comprising a side wall.

4. The mechanism of claim 1, further comprising a side wall having the slot.

5. The mechanism of claim 1, further comprising an opposed latch bar that is opposed to the latch bar.

6. The mechanism of claim 1, wherein the four-bar linkage comprises an arm that extends from the grab bar.

7. The mechanism of claim 1, further comprising a backing.

8. The mechanism of claim 1, wherein the latch bar has a dog-leg.

9. A method for servicing a sled installed in a server, the method comprising:
    sweeping a grab bar from a stowed position to a deployed position; and
    moving a four-bar linkage comprising a slider bar pivotally connected to an arm connected to the grab bar from a first position to a second position by sliding the slider bar in a slot with a curved lifting region, the first position engaging a latch bar the sled to a chassis of the server in the stowed position of the grab bar, and a movement of the grab bar to the second position moves the slider bar and pushes the latch bar into the lifting region and disengages the latch bar from the chassis of the server in the deployed position of the grab bar;
    wherein the sweeping of the grab bar moves the four-bar linkage from the first position to the second position and disengages the latch bar from the chassis and allows the sled to be removed from the chassis.

10. The method of claim 9, further comprising a thumb latch.

11. The method of claim 9, further comprising a side wall.

12. The method of claim 11, further comprising a side wall having the lifting region of the slot.

13. The method of claim 9, further comprising removing the sled from the chassis of the server.

14. The method of claim 9, further comprising inserting the sled into the chassis of the server.

15. The method of claim 9, further comprising receiving an electrical power.

16. The method of claim 9, further comprising lifting the grab bar.

17. An information handling system, comprising:
    a hardware processor;
    a memory device;
    a sled;
    an assist mechanism integrated with the sled, the assist mechanism including a grab bar with an arm pivotally connected to a slider bar of a four-bar linkage, the four-bar linkage having a first position engaging a latch bar of the sled to a chassis of the information handling system in a stowed position of the grab bar, and the four-bar linkage having a second position disengaging the sled from the chassis of the server in a deployed position of the grab bar; and a slot with a curved lifting region along which the slider bar slides;
wherein a movement of the grab bar moves the slider bar and pushes the latch bar into the lifting region and moves the four-bar linkage from the stowed position to the deployed position, thus disengaging the latch bar and the sled from the chassis and allowing the sled to be removed from the chassis for a service.

18. The information handling system of claim 17, wherein the assist mechanism comprises a thumb latch bar.

19. The information handling system of claim 17, wherein the assist mechanism comprises a side wall.

20. The information handling system of claim 17, further comprising a power supply.

* * * * *

UNITED STATES PATENT AND TRADEMARK OFFICE
CERTIFICATE OF CORRECTION

| | |
|---|---|
| PATENT NO. | : 10,863,647 B1 |
| APPLICATION NO. | : 16/570109 |
| DATED | : December 8, 2020 |
| INVENTOR(S) | : Eduardo Escamilla et al. |

It is certified that error appears in the above-identified patent and that said Letters Patent is hereby corrected as shown below:

In the Claims

Column 10, Line 32: Please change "engaging a latch bar the sled to a chassis" to --engaging a latch bar to a chassis--

Signed and Sealed this
Twenty-sixth Day of January, 2021

Drew Hirshfeld
*Performing the Functions and Duties of the*
*Under Secretary of Commerce for Intellectual Property and*
*Director of the United States Patent and Trademark Office*